(12) United States Patent
Gang

(10) Patent No.: US 12,364,040 B2
(45) Date of Patent: Jul. 15, 2025

(54) SEMICONDUCTOR PACKAGE

(71) Applicant: Samsung Electronics Co., Ltd., Suwon-si (KR)

(72) Inventor: Donghoon Gang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 246 days.

(21) Appl. No.: 18/167,415

(22) Filed: Feb. 10, 2023

(65) Prior Publication Data
US 2023/0187460 A1 Jun. 15, 2023

Related U.S. Application Data

(63) Continuation of application No. 16/876,668, filed on May 18, 2020, now Pat. No. 11,605,658.

(30) Foreign Application Priority Data

Aug. 28, 2019 (KR) .................... 10-2019-0105932

(51) Int. Cl.
*H10F 39/00* (2025.01)
*H01L 23/00* (2006.01)
*H01L 25/065* (2023.01)
*H01L 25/16* (2023.01)
*H10F 39/18* (2025.01)

(52) U.S. Cl.
CPC .......... *H10F 39/804* (2025.01); *H01L 24/02* (2013.01); *H01L 24/09* (2013.01); *H01L 24/17* (2013.01); *H01L 25/0657* (2013.01); *H01L 25/167* (2013.01); *H10F 39/018* (2025.01); *H10F 39/182* (2025.01); *H10F 39/8053* (2025.01); *H10F 39/8063* (2025.01); *H10F 39/809* (2025.01); *H10F 39/811* (2025.01); *H01L 2224/80001* (2013.01)

(58) Field of Classification Search
CPC ........ H01L 24/02; H01L 24/06; H01L 24/09; H01L 24/17; H01L 25/0657; H01L 25/167; H10F 39/011; H10F 39/018; H10F 39/80; H10F 39/182; H10F 39/804; H10F 39/8053; H10F 39/8063; H10F 39/809; H10F 39/811
USPC ........................................................ 257/432
See application file for complete search history.

(56) References Cited

U.S. PATENT DOCUMENTS

| | | |
|---|---|---|
| 6,661,084 B1 | 12/2003 | Peterson et al. |
| 9,379,072 B2 | 6/2016 | Liu et al. |
| 9,634,059 B2 | 4/2017 | Chiu |
| 10,249,672 B2 | 4/2019 | Fujimori et al. |
| 10,714,454 B2 | 7/2020 | Hsieh |

(Continued)

FOREIGN PATENT DOCUMENTS

KR 100609121 B1 8/2006

*Primary Examiner* — Fazli Erdem
(74) *Attorney, Agent, or Firm* — Myers Bigel, P.A.

(57) ABSTRACT

A semiconductor package includes a first semiconductor chip having a first surface and a second surface opposite to each other, a second semiconductor chip on the second surface of the first semiconductor chip and electrically connected to the first semiconductor chip, and a molding pattern bordering side surfaces of the first semiconductor chip and side surfaces of the second semiconductor chip. At least a portion of the first surface of the first semiconductor chip is free of the molding pattern. A glass pattern is on the first surface of the first semiconductor chip.

20 Claims, 10 Drawing Sheets

(56) References Cited

U.S. PATENT DOCUMENTS

| | | | |
|---|---|---|---|
| 2013/0221470 A1 | 8/2013 | Kinsman et al. | |
| 2014/0070348 A1 | 3/2014 | Yee et al. | |
| 2015/0200219 A1 | 7/2015 | Oganesian | |
| 2017/0345859 A1 | 11/2017 | Hsieh | |
| 2018/0337142 A1 | 11/2018 | Cheng et al. | |
| 2019/0074309 A1 | 3/2019 | Wang et al. | |
| 2019/0074399 A1 | 3/2019 | Masuda | |
| 2019/0139843 A1 | 5/2019 | Shigeta et al. | |
| 2019/0140011 A1 | 5/2019 | Kim et al. | |
| 2019/0140012 A1 | 5/2019 | Kuan et al. | |
| 2019/0157333 A1 | 5/2019 | Tsai | |
| 2019/0305023 A1* | 10/2019 | Wu | H01L 27/14618 |

* cited by examiner

SEMICONDUCTOR PACKAGE

CROSS-REFERENCE TO RELATED APPLICATIONS

This application is a continuation of U.S. patent application Ser. No. 16/876,668, filed May 18, 2020, which claims priority under 35 U.S.C. § 119 to Korean Patent Application No. 10-2019-0105932, filed on Aug. 28, 2019, in the Korean Intellectual Property Office, the entire contents of which are hereby incorporated by reference.

BACKGROUND OF THE INVENTION

The present disclosure relates to a semiconductor package, and, in particular, to a semiconductor package including an image sensor chip.

An image sensor, such as a charge-coupled device (CCD) sensor or a complementary metal—oxide—semiconductor (CMOS) image sensor, may be used in various electronic products, such as mobile phones, digital cameras, optical mice, security cameras, and biometric devices. Due to an increasing demand for small and multifunctional electronic products, a semiconductor package including an image sensor may be designed to have improved technical properties (e.g., small size, high density, low power consumption, multifunction, high signal-processing speed, high reliability, low cost, and/or clear image quality). Research and development efforts have been undertaken in attempts to realize such technical properties in semiconductor packages.

SUMMARY

Some embodiments of the inventive concept provide a semiconductor package including an image sensor chip with a reduced area.

According to some embodiments of the inventive concept, a semiconductor package may include a first semiconductor chip having a first surface and a second surface opposite to each other, a second semiconductor chip on the second surface of the first semiconductor chip and electrically connected to the first semiconductor chip, and a molding pattern bordering side surfaces of the first semiconductor chip and side surfaces of the second semiconductor chip. At least a portion of the first surface of the first semiconductor chip is free of the molding pattern. A glass pattern is on the first surface of the first semiconductor chip.

According to some embodiments of the inventive concept, a semiconductor package may include an image sensor chip having a first surface and a second surface opposite to each other, a semiconductor chip on the second surface of the image sensor chip and electrically connected to the image sensor chip, a molding pattern bordering side surfaces of the image sensor chip and side surfaces of the semiconductor chip, and a glass pattern on the first surface of the image sensor chip. The molding pattern may have a top surface in physical contact with the glass pattern.

According to an embodiment of the inventive concept, a semiconductor package may include a first semiconductor chip having a first surface and a second surface opposite to each other, the first semiconductor chip including micro lenses on the first surface, a second semiconductor chip on the second surface of the first semiconductor chip, the second semiconductor chip including through vias and having a third surface adjacent to the second surface of the first semiconductor chip and a fourth surface opposite to the third surface, a re-distribution structure on the fourth surface of the second semiconductor chip, a molding pattern on side surfaces of the first semiconductor chip and side surfaces of the second semiconductor chip, and a glass pattern on the micro lenses.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
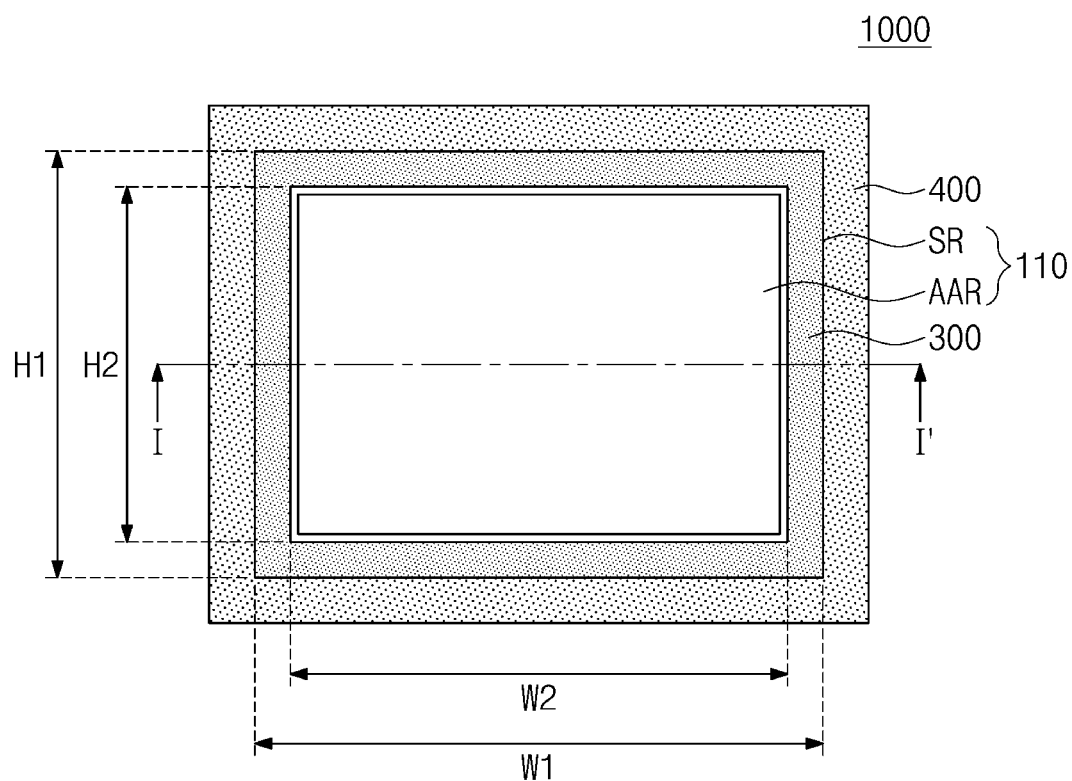
FIG. 1 is a plan view illustrating a semiconductor package according to some embodiments of the inventive concept.

It should be noted that these figures are intended to illustrate the general characteristics of methods, structures, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity.

DETAILED DESCRIPTION

Example embodiments of the inventive concepts will now be described more fully with reference to the accompanying drawings, in which example embodiments are shown. The same reference numerals or the same reference designators may denote the same elements or components throughout the specification.

As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2:
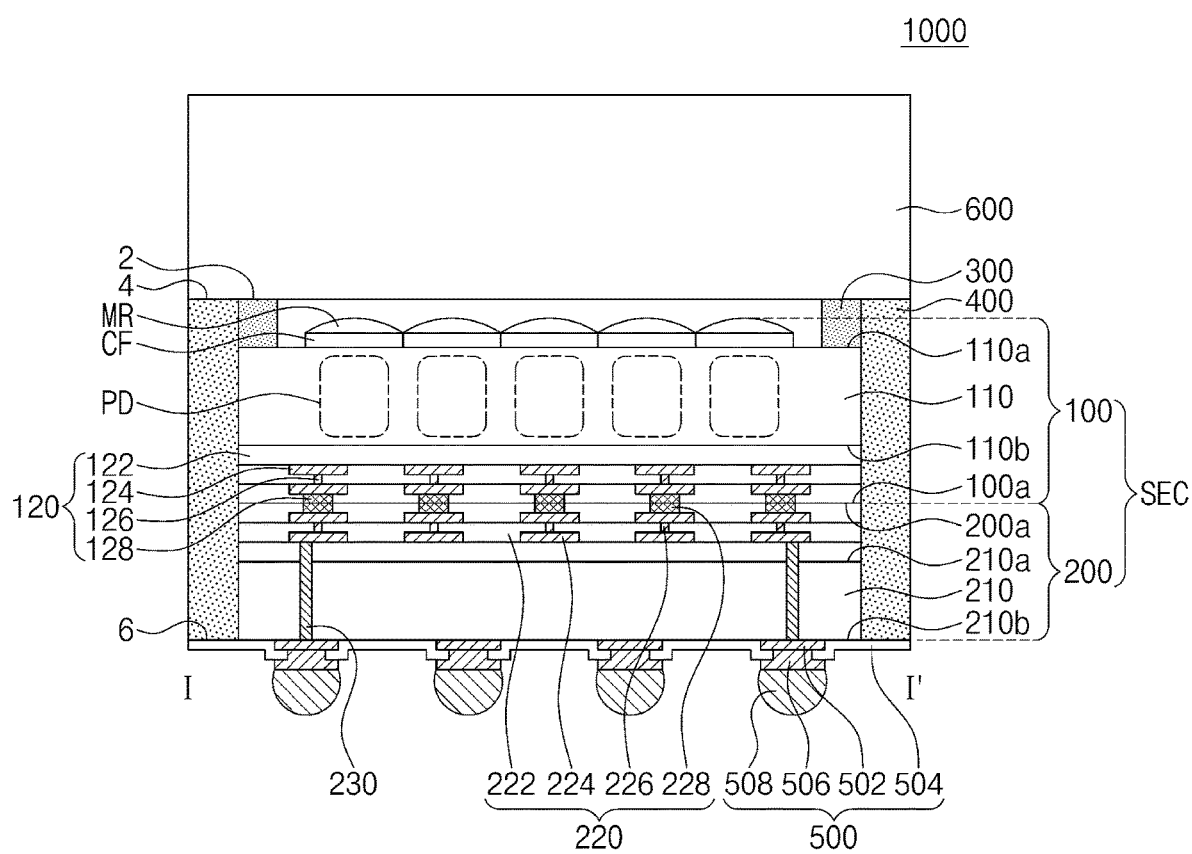
FIG. 2 is a sectional view, which is taken along a line I-I' of FIG. 1, to illustrate a semiconductor package according to some embodiments of the inventive concept.

FIG. 1 is a plan view illustrating a semiconductor package according to some embodiments of the inventive concept. FIG. 2 is a sectional view which is taken along a line I-I' of FIG. 1 to illustrate a semiconductor package according to some embodiments of the inventive concept.

Referring to FIGS. 1 and 2, a semiconductor package 1000 may include a semiconductor chip SEC, an adhesive layer 300, a molding pattern 400, a re-distribution structure 500, and a glass pattern 600. The semiconductor chip SEC may include a first semiconductor chip 100 and a second semiconductor chip 200, which are stacked on each other in a vertical direction in the cross-sectional view of FIG. 2. A planar area (W1*H1) of the semiconductor chip SEC may be about 5.65 mm×4.345 mm. The first semiconductor chip 100 may have a first surface 110a and a second surface 100a that are opposite to each other. The first semiconductor chip 100 may include a first semiconductor layer 110, a first interconnection structure 120, color filters CF, and micro lenses MR. The first semiconductor layer 110 may have a top surface 110a and a bottom surface 110b that are opposite to each other. The first surface 110a of the first semiconductor chip 100 may be the same surface as the top surface 110a of the first semiconductor layer 110. The first semiconductor layer 110 may comprise one or more semiconductor materials (e.g., silicon (Si), silicon germanium (SiGe), and doped semiconductor materials). Photoelectric conversion devices PD may be disposed in the first semiconductor layer 110. Each of the photoelectric conversion devices PD may independently receive light, which is incident on the first surface 110a of the first semiconductor chip 100. The photoelectric conversion devices PD may have a conductivity type different from a conductivity type of the first semiconductor layer 110.

The first interconnection structure 120 may be disposed on the bottom surface 110b of the first semiconductor layer 110. The first interconnection structure 120 may include first insulating layers 122, first interconnection lines 124, first vias 126, and first bonding pads 128. The first insulating layers 122 may be sequentially stacked on the bottom surface 110b of the first semiconductor layer 110. A surface of the first insulating layer 122, which is farthest from the bottom surface 110b of the first semiconductor layer 110, may correspond to the second surface 100a of the first semiconductor chip 100. The first insulating layers 122 may comprise one or more insulating materials (e.g., silicon oxide ($SiO_x$)). The first interconnection lines 124 may be disposed in the first insulating layers 122. The first interconnection lines 124 may comprise one or more metallic materials (e.g., copper (Cu), aluminum (Al), nickel (Ni), and tungsten (W)) and/or barrier metal materials (e.g., tantalum (Ta) and titanium (Ti)). The first vias 126 may be disposed between the first interconnection lines 124. The first vias 126 may electrically connect the first interconnection lines 124 to each other. The first interconnection lines 124 may comprise one or more metallic materials (e.g., copper (Cu), aluminum (Al), nickel (Ni), and tungsten (W)). The first bonding pads 128 may be disposed on the first interconnection lines 124, which are farthest from the bottom surface 110b of the first semiconductor layer 110. The first bonding pads 128 may be disposed in the first insulating layer 122, which is farthest from the bottom surface 110b of the first semiconductor layer 110. The first bonding pads 128 may comprise metallic materials (e.g., copper (Cu), aluminum (Al), nickel (Ni), tungsten (W), and tin (Sn)).

The color filters CF may be disposed on the first surface 110a of the first semiconductor layer 110. The color filters CF may be disposed to correspond to the photoelectric conversion devices PD, i.e., aligned in a vertical direction in the cross-sectional view of FIG. 2. The color filters CF may include at least one of red, green, blue, or white color filters.

The micro lenses MR may be disposed on the color filters CF. One color filter CF, one micro lens MR corresponding to the one color filter CF, and at least one photoelectric conversion device PD corresponding to the one color filter CF and the one micro lens MR may be defined as a unit pixel. In some embodiments, a plurality of unit pixels may be two-dimensionally arranged on the first surface 110a of the first semiconductor layer 110. A center region of the first semiconductor layer 110 including the unit pixels may be defined as an active array region AAR. In other words, when viewed in a plan view, the active array region AAR may be a region in which the micro lenses MR are exposed to the glass pattern 600. A planar area (L2*H2) of the active array region AAR may be about 5.350 mm×4.045 mm. An edge portion of the first semiconductor layer 110, in which the unit pixels are not disposed, may be defined as an adhesion region SR.

The second semiconductor chip 200 may be disposed on the second surface 100a of the first semiconductor chip 100. The second semiconductor chip 200 may have a third surface 200a and a fourth surface 210b that are opposite to each other. The third surface 200a of the second semiconductor chip 200 may be adjacent to the second surface 100a of the first semiconductor chip 100 and may be in direct physical contact with the second surface 100a of the first semiconductor chip 100. The second semiconductor chip 200 may include a second semiconductor layer 210, a second interconnection structure 220, and through vias 230. The second semiconductor layer 210 may have a top surface 210a and a bottom surface 210b that are opposite to each other. The bottom surface 210b of the second semiconductor layer 210 may be the same surface as the fourth surface 210b of the second semiconductor chip 200. The second semiconductor layer 210 may comprise one or more semiconductor materials (e.g., silicon (Si), silicon germanium (SiGe), and doped semiconductor materials). Although not illustrated in the drawings, impurity regions and device isolation layers may be disposed in the second semiconductor layer 210. In addition, gate electrodes of transistors may be disposed on the top surface 210a of the second semiconductor layer 210.

The second interconnection structure 220 may be disposed on the top surface 210a of the second semiconductor layer 210. The second interconnection structure 220 may include second insulating layers 222, second interconnection lines 224, second vias 226, and second bonding pads 228. The second insulating layers 222 may be sequentially stacked on the top surface 210a of the second semiconductor layer 210. A surface of the second insulating layer 222, which is farthest from the top surface 210a of the second semiconductor layer 210, may correspond to the third surface 200a of the second semiconductor chip 200. The second insulating layers 222 may comprise one or more insulating materials (e.g., silicon oxide ($SiO_x$)).

The second interconnection lines 224 may be disposed in the second insulating layers 222. The second interconnection lines 224 may comprise one or more metallic materials (e.g., copper (Cu), aluminum (Al), nickel (Ni), and tungsten (W)) and/or barrier metal materials (e.g., tantalum (Ta) and titanium (Ti)). The second vias 226 may be disposed between the second interconnection lines 224. The second vias 226 may electrically connect the second interconnection lines 224 to each other. The second interconnection lines 224 may comprise one or more metallic materials (e.g., copper (Cu), aluminum (Al), nickel (Ni), and tungsten (W)). The second bonding pads 228 may be disposed on the second interconnection lines 224, which are farthest from the top surface 210a of the second semiconductor layer 210. The second bonding pads 228 may be disposed in the second insulating layer 222, which is farthest from the top surface 210a of the second semiconductor layer 210. The second bonding pads 228 may comprise one or more metallic materials (e.g., copper (Cu), aluminum (Al), nickel (Ni), tungsten (W), and tin (Sn)). The second bonding pads 228 may be disposed on the first bonding pads 128 and may be vertically aligned to the first bonding pads 128 as shown in the cross-sectional view of FIG. 2. The second bonding pads 228 and the first bonding pads 128 may be in physical contact with each other. The first semiconductor chip 100 and the second semiconductor chip 200 may be electrically connected to each other through the first interconnection structure 120 and the second interconnection structure 220.

The through vias 230 may be configured to penetrate the second semiconductor layer 210. The through vias 230 may penetrate the second semiconductor layer 210 and the second insulating layer 222, which is adjacent to the top surface 210a of the second semiconductor layer 210. The through vias 230 may be in physical contact with and electrically connected to the second interconnection lines 224, which are closest to the top surface 210a of the second semiconductor layer 210. The through vias 230 may expose the bottom surface 210b of the second semiconductor layer 210. That is, the through vias 230 may extend all the way through the second semiconductor layer 210 from the top surface 210a to the bottom surface 210b. The through vias 230 may comprise one or more metallic materials (e.g., copper (Cu) and tungsten (W)).

The adhesive layer 300 may be disposed on the adhesion region SR of the first semiconductor layer 110 and on the first surface 110a of the first semiconductor layer 110. When viewed in a plan view (see FIG. 1), the adhesive layer 300 may have a rectangular ring shape. When measured from the first surface 110a of the first semiconductor layer 110, a top surface 2 of the adhesive layer 300 may be positioned at a level higher than top surfaces of micro lenses MR. The top surfaces of the micro lenses MR may correspond to portions of the micro lenses MR, which are closest to the glass pattern 600. The adhesive layer 300 may be spaced apart from the outermost ones of the color filters CF and the outermost ones of the micro lenses MR by a specific distance. The adhesive layer 300 may comprise a material, which can robustly fasten the first semiconductor layer 110 to the glass pattern 600. The adhesive layer 300 may include one or more materials comprising, for example, non-conductive paste (NCP), non-conductive film (NCF), anisotropic film (ACF), ultraviolet (UV) film, instant adhesives, heat-curable adhesives, laser-curable adhesives, and/or ultrasonic-curable adhesives. The adhesive layer 300 may be a glass layer, on which an adhesive material is coated.

The molding pattern 400 may be disposed on and may at least partially enclose side surfaces of the first semiconductor chip 100 and side surfaces of the second semiconductor chip 200. The molding pattern 400 may be on and at least partially cover side surfaces of the first semiconductor layer 110, side surfaces of the first interconnection structure 120, side surfaces of the second semiconductor layer 210, side surfaces of the second interconnection structure 220, and side surfaces of the adhesive layer 300. The adhesive layer 300 may be in physical contact with a portion of an inner side surface of the molding pattern 400, which is exposed by or is free of the first semiconductor layer 110. The molding pattern 400 may expose the first surface 110a of the first semiconductor chip 100 and the fourth surface 210b of the second semiconductor chip 200, i.e., at least a portion of the first surface 110a of the first semiconductor chip 100 and at least a portion of the fourth surface 210b of the second semiconductor chip 200 may be free of the molding pattern 400. When measured from the first surface 110a of the first semiconductor layer 110 (i.e., using the first surface 110a being a base reference surface), a top surface 4 of the molding pattern 400, which is in contact with the glass pattern 600, may be positioned at a higher level than top surfaces of the micro lenses MR as shown in the cross-sectional view of FIG. 2. In other words, the level of the top surface 4 of the molding pattern 400 may be higher than the level of the first surface 110a of the first semiconductor layer 110 relative to the first surface 110a being a base reference surface. The top surface 4 of the molding pattern 400 may be coplanar with the top surface 2 of the adhesive layer 300. A bottom surface 6, which is opposite to the top surface 4 of the molding pattern 400, may be coplanar with the fourth surface 210b of the second semiconductor chip 200. The molding pattern 400 may comprise an epoxy molding compound.

The re-distribution structure 500 may be disposed on the fourth surface 210b of the second semiconductor chip 200. The re-distribution structure 500 may include redistributions 502, a protection insulating layer 504, terminal pads 506, and connection terminals 508. The redistributions 502 may be disposed on the fourth surface 210b of the second semiconductor chip 200. The redistributions 502 may be in physical contact with the through vias 230, which are exposed by the second semiconductor layer 210, i.e., at least a portion of each of the redistributions 502 is free of the second semiconductor layer 210. Accordingly, the through vias 230 may electrically connect the redistributions 502 to the second interconnection lines 224. The redistributions 502 may be locally disposed on the fourth surface 210b of the second semiconductor chip 200. For example, at least one of the redistributions 502 may not overlap the molding pattern 400, when viewed in a plan view. The redistributions 502 may comprise one or more metallic materials (e.g., copper (Cu), tungsten (W), and aluminum (Al)).

The protection insulating layer 504 may be disposed on the fourth surface 210b of the second semiconductor chip 200 and the bottom surface 6 of the molding pattern 400. The protection insulating layer 504 may be on and at least partially cover the fourth surface 210b of the second semiconductor chip 200 and the bottom surface 6 of the molding pattern 400. The protection insulating layer 504 may expose portions of the redistributions 502, i.e., at least a portion of each of the redistributions 502 is free of the protection insulating layer 504. The protection insulating layer 504 may comprise a polymer layer and/or a silicon oxide layer.

The polymer layer may comprise one or more of photosensitive polyimide (PSPI), polybenzoxazole (PBO), phenolic polymer, and/or benzocyclobutene polymer (BCB). The terminal pads 506 may be disposed on portions of the redistributions 502 exposed by the protection insulating layer 504. The terminal pads 506 may be in physical contact with the redistributions 502 and may be electrically connected to the redistributions 502. The terminal pads 506 may be comprise one or more metallic materials (e.g., copper (Cu) and tin (Sn)) and/or barrier metal materials (e.g., titanium (Ti) and tantalum (Ta)). The connection terminals 508 may be disposed on the terminal pads 506. The connection terminals 508 may be disposed to be in direct physical contact with the terminal pads 506. At least one of the connection terminals 508 may not overlap the molding pattern 400 when viewed in a plan view. In other words, the connection terminals 508 may be locally disposed on a region of the second semiconductor chip 200. The connection terminals 508 may comprise one or more solder balls, solder bumps, and/or metal fillers.

The glass pattern 600 may be disposed on the first surface 110a of the first semiconductor chip 100. For example, the glass pattern 600 may be disposed on the adhesive layer 300 and the molding pattern 400, and the glass pattern 600 may be in physical contact with the top surface 2 of the adhesive layer 300 and the top surface 4 of the molding pattern 400. The glass pattern 600 may be spaced apart from the micro lenses MR. A width of the glass pattern 600 in a horizontal direction in the cross-sectional view of FIG. 2 may be substantially equal to a sum of a width of the first or second semiconductor chip 100 or 200 and a width of the molding pattern 400. Side surfaces of the glass pattern 600 may be vertically aligned with outer side surfaces of the molding pattern 400 in the cross-sectional view of FIG. 2. The glass pattern 600 may comprise a transparent material (e.g., glass) and may transmit light.

According to an embodiment of the inventive concept, the semiconductor chip SEC including image sensors may be electrically connected to external elements through the through vias 230 of the second semiconductor chip 200 and the redistributions 502, which are electrically connected to the through vias 230, and are formed on the bottom surface of the semiconductor chip SEC (i.e., the fourth surface 210b of the second semiconductor chip 200). Accordingly, it may be possible to reduce an area of the semiconductor chip SEC and to freely form the redistributions 502 on the bottom surface of the semiconductor chip SEC. As a result, it may be possible to increase a degree of freedom of the connection terminals 508, which are formed on the redistributions 502.

Figure 3:
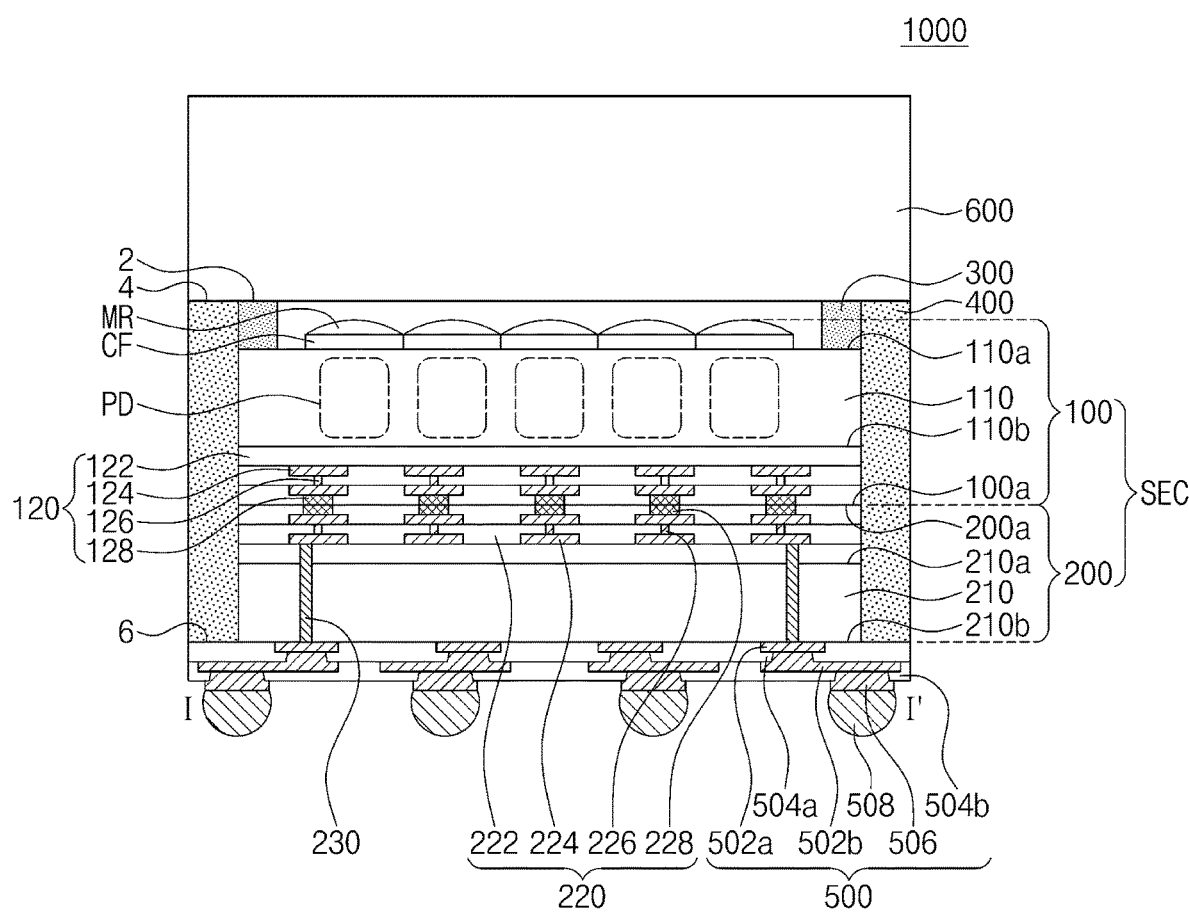
FIG. 3 is a sectional view, which is taken along a line I-I' of FIG. 1, to illustrate a semiconductor package according to some embodiments of the inventive concept.

FIG. 3 is a sectional view which is taken along a line I-I' of FIG. 1 to illustrate a semiconductor package according to some embodiments of the inventive concept.

Referring to FIG. 3, the re-distribution structure 500 may include first redistributions 502a, a first protection insulating layer 504a, second redistributions 502b, a second protection insulating layer 504b, the terminal pads 506, and the connection terminals 508. The first redistributions 502a may be disposed on the fourth surface 210b of the second semiconductor chip 200. The first redistributions 502a may be locally disposed on the fourth surface 210b of the second semiconductor chip 200. The first protection insulating layer 504a may be disposed on the fourth surface 210b of the second semiconductor chip 200 and the bottom surface 6 of the molding pattern 400. The first protection insulating layer 504a may be on and at least partially cover the fourth surface 210b of the second semiconductor chip 200 and the bottom surface 6 of the molding pattern 400. The first protection insulating layer 504a may be formed to expose portions of the first redistributions 502a, i.e., at least portions of the first redistributions 502a may be free of the first protection layer 504a.

The second redistributions 502b may be disposed on the first redistributions 502a to be in physical contact with the first redistributions 502a. The second redistributions 502b may be on and at least partially cover portions of the first protection insulating layer 504a. At least one of the second redistributions 502b may be extend onto a portion of the first protection insulating layer 504a, which is on and at least partially covers the bottom surface 6 of the molding pattern 400. Accordingly, at least one of the second redistributions 502b may overlap the molding pattern 400, when viewed in a plan view. The second protection insulating layer 504b may be disposed on the first protection insulating layer 504a. The second protection insulating layer 504b may be on and at least partially cover the first protection insulating layer 504a and the second redistributions 502b. The second protection insulating layer 504b may expose portions of the second redistributions 502b, i.e., at least portions of the second redistributions 502b may be free of the second protection insulating layer 504b. The terminal pads 506 may be disposed on portions of the second redistributions 502b, which are exposed by the second protection insulating layer 504b. The terminal pads 506 may be in direct physical contact with the portions of the second redistributions 502b. The terminal pads 506 may be electrically connected to the second redistributions 502b. At least one of the terminal pads 506 may overlap the molding pattern 400, when viewed in a plan view. The connection terminals 508 may be disposed on the terminal pads 506. At least one of the connection terminals 508 may overlap the molding pattern 400, when viewed in a plan view.

Figure 4:
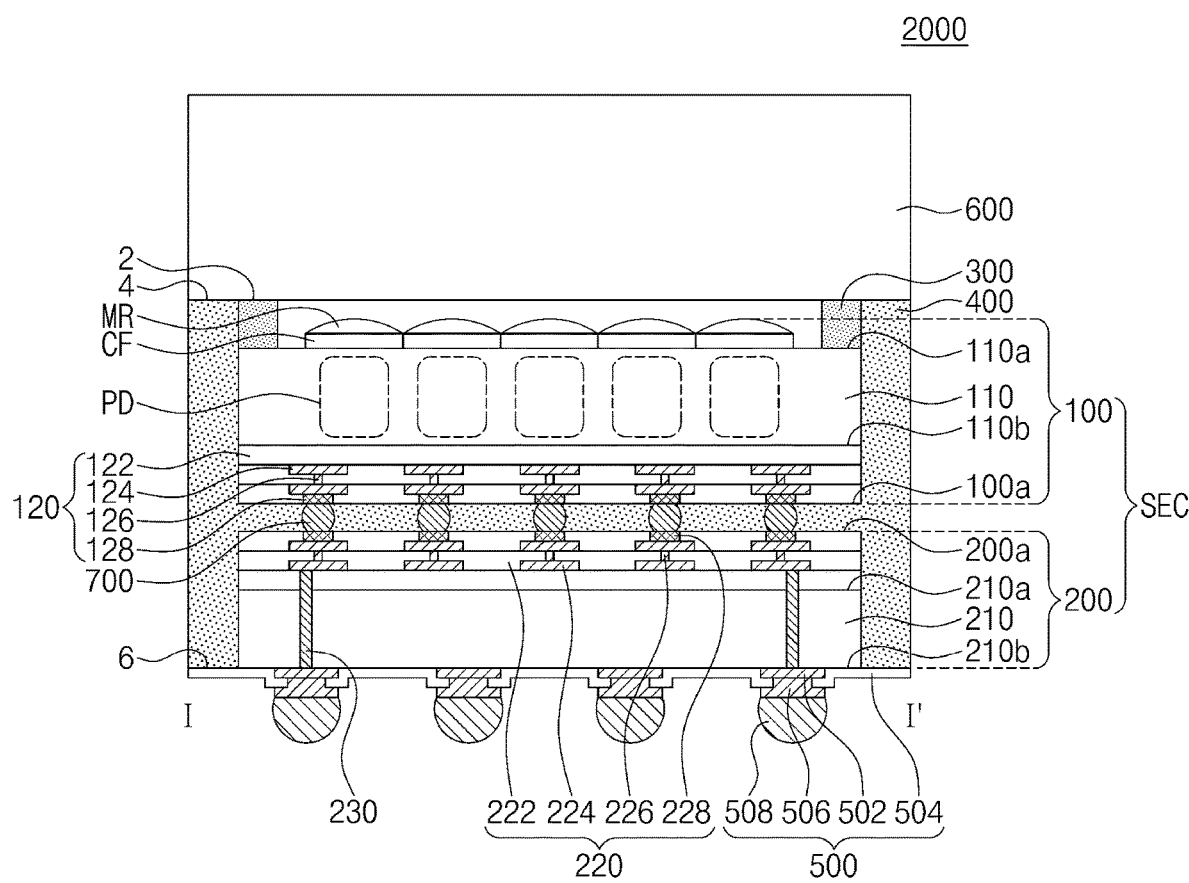
FIG. 4 is a sectional view, which is taken along a line I-I' of FIG. 1, to illustrate a semiconductor package according to some embodiments of the inventive concept.

FIG. 4 is a sectional view, which is taken along a line I-I' of FIG. 1, to illustrate a semiconductor package according to some embodiments of the inventive concept.

Referring to FIG. 4, a semiconductor package 2000 may include the first semiconductor chip 100, the second semiconductor chip 200, the adhesive layer 300, the molding pattern 400, the re-distribution structure 500, the glass pattern 600, and chip connection terminals 700. The chip connection terminals 700 may be disposed between the first bonding pads 128 and the second bonding pads 228. The chip connection terminals 700 may electrically connect the first bonding pads 128 to the second bonding pads 228. The chip connection terminals 700 may be formed of or include at least one of, for example, solder balls, solder bumps, or metal fillers.

The molding pattern 400 may be disposed in a space between the first semiconductor chip 100 and the second semiconductor chip 200. For example, the molding pattern 400 may at least partially fill a space between the first interconnection structure 120 and the second interconnection structure 220 and may cover side surfaces of the chip connection terminals 700.

FIGS. 5A to 5F are sectional views illustrating a method of fabricating a semiconductor package, according to some embodiments of the inventive concept.

Figure 5A:
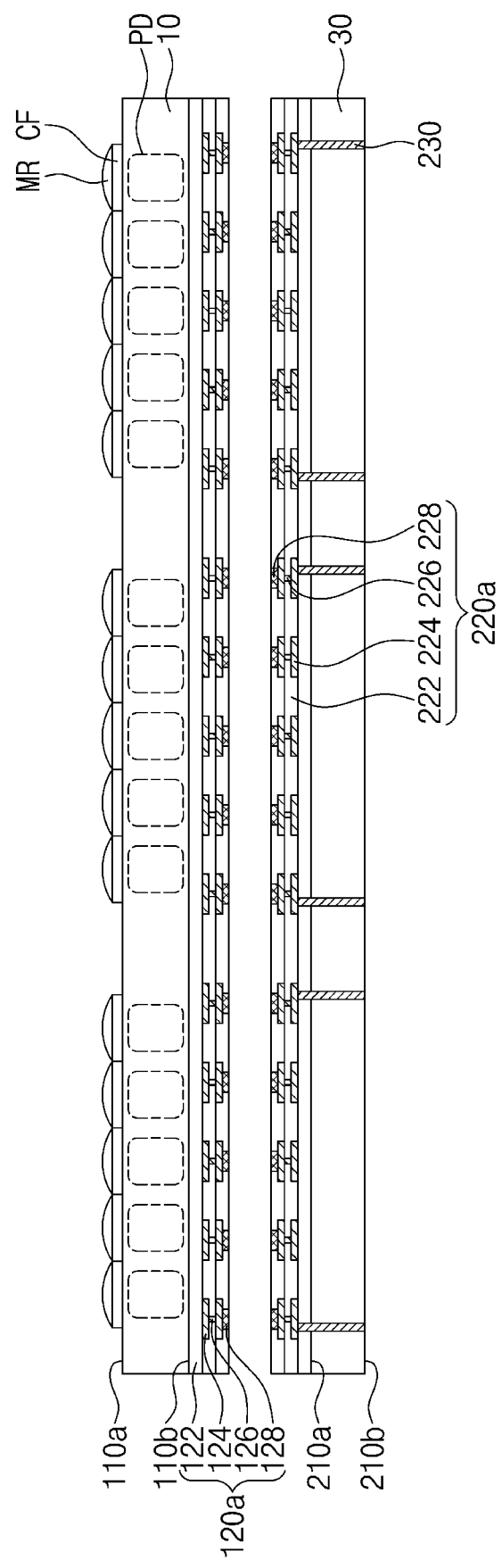
FIGS. 5A to 5F are sectional views illustrating a method of fabricating a semiconductor package, according to some embodiments of the inventive concept.

Referring to FIG. 5A, a first substrate 10 may be prepared. The first substrate 10 may have a top surface 110a and a bottom surface 110b that are opposite to each other. In some embodiments, the first substrate 10 may comprise a silicon wafer. The first substrate 10 may comprise one or more semiconductor materials (e.g., silicon (Si), silicon germanium (SiGe), doped semiconductor materials). The photoelectric conversion devices PD may be formed in the first substrate 10. The photoelectric conversion devices PD may be formed by doping the first substrate 10 with impurities, using, for example, an ion implantation process. The color filters CF may be formed on the top surface 110a of the first substrate 10, and the micro lenses MR may be formed on the color filters CF.

A first interconnection structure layer 120a may be formed on the bottom surface 110b of the first substrate 10. The first interconnection structure layer 120a may be formed on a portion or the entire surface of the bottom surface 110b of the first substrate 10. The first interconnection structure layer 120a may include the first insulating layers 122, the first interconnection lines 124, the first vias 126, and the first bonding pads 128. The first insulating layers 122 may be sequentially formed on the bottom surface 110b of the first substrate 10. The first interconnection lines 124 and the first vias 126 may be formed in the first insulating layers 122.

The first vias 126 may be formed between vertically adjacent ones of the first interconnection lines 124 and may electrically connect vertically adjacent ones of the first interconnection lines 124 to each other. The first bonding pads 128 may be formed on the first interconnection lines 124, which are farthest from the bottom surface 110b of the first substrate 10. The first bonding pads 128 may be formed to be in physical contact with the first interconnection lines 124, which are farthest from the bottom surface 110b of the first substrate 10. The first insulating layer 122, which is farthest from the bottom surface 110b of the first substrate 10, may be formed to expose surfaces of the first bonding pads 128, i.e., surfaces of the first bonding pads 128 may be free of the first insulating layer 122.

A second substrate 30 may be prepared. The second substrate 30 may have a top surface 210a and a bottom surface 210b that are opposite to each other. In some embodiments, the second substrate 30 may comprise a silicon wafer. The second substrate 30 may comprise one or more semiconductor materials (e.g., silicon (Si), silicon germanium (SiGe), and doped semiconductor materials).

A second interconnection structure layer 220a may be disposed on the top surface 210a of the second substrate 30. The second interconnection structure layer 220a may include the second insulating layers 222, the second interconnection lines 224, the second vias 226, and the second bonding pads 228. The second insulating layers 222 may be sequentially formed on the top surface 210a of the second substrate 30. The second interconnection lines 224 and the second vias 226 may be formed in the second insulating layers 222. The second vias 226 may be formed between vertically adjacent ones of the second interconnection lines 224 and may electrically connect vertically adjacent ones of the second interconnection lines 224 to each other. The second bonding pads 228 may be formed on the second interconnection lines 224, which are farthest from the top surface 210a of the second substrate 30. The second bonding pads 228 may be disposed to be in physical contact with the second interconnection lines 224, which are farthest from the top surface 210a of the second substrate 30. The second insulating layer 222, which is farthest from the top surface 210a of the second substrate 30, may be formed to expose surfaces of the second bonding pads 228, i.e., surfaces of the second bonding pads 228 may be free of the first insulating layer 222.

The through vias 230 may be disposed in the second substrate 30. The through vias 230 may be provided to penetrate the second substrate 30. The through vias 230 may penetrate the second insulating layer 222, which is closest to the top surface 210a of the second substrate 30, and may be in physical contact with the second interconnection lines 224, which are closest to the top surface 210a of the second substrate 30. The through vias 230 may be electrically connected to the second interconnection lines 224. The bottom surface 210b of the second substrate 30 may be formed to expose surfaces of the through vias 230, i.e., surfaces of the through vias 230 may be free of the second substrate 30.

Figure 5B:
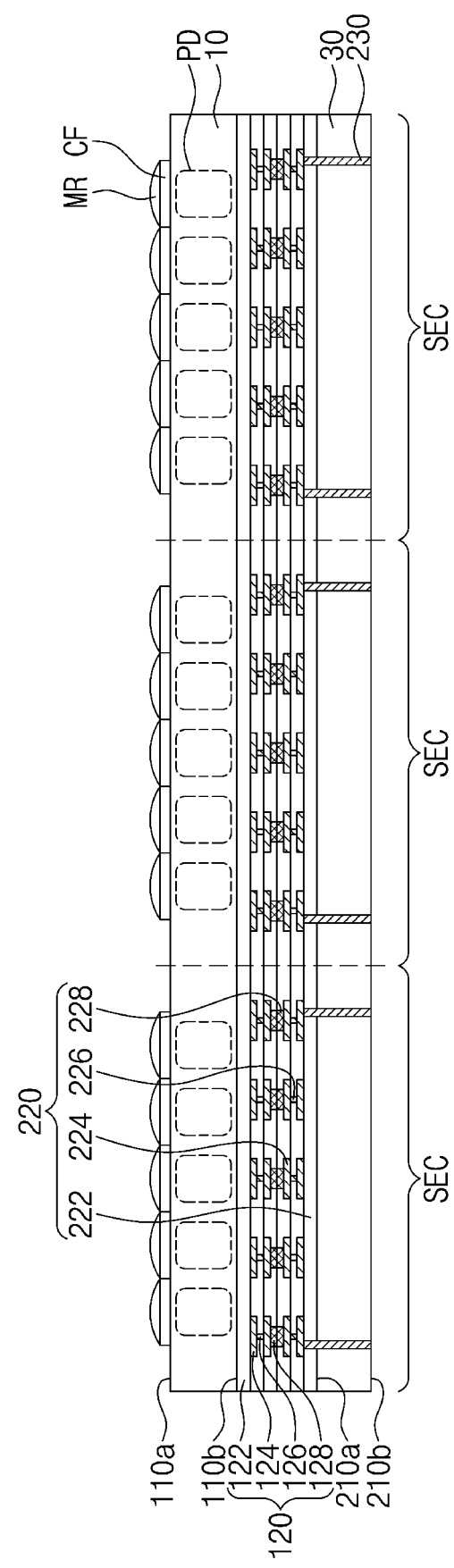

Referring to FIG. 5B, the first substrate 10, on which the first interconnection structure layer 120a, the color filters CF, and the micro lenses MR are formed, may be bonded to the second substrate 30, on which the second interconnection structure layer 220a is formed. For example, the first bonding pads 128 of the first interconnection structure layer 120a may be placed to be in physical contact with the second bonding pads 228 of the second interconnection structure layer 220a, and then, a thermal treatment process may be performed to physically combine the first bonding pads 128 with the second bonding pads 228. In other words, the first substrate 10 and the second substrate 30 may be bonded to each other by the first and second interconnection structure layers 120a and 220a. In some embodiments, after the thermal treatment process, one of the first bonding pads 128 and a corresponding one of the second bonding pads 228, which are combined with each other, may form a single object.

A cutting process may be performed on the combined structure of the first substrate 10, the first interconnection structure layer 120a, the second substrate 30, and the second interconnection structure layer 220a to form a plurality of semiconductor chips SEC. Each of the semiconductor chips SEC may include the first semiconductor chip 100 and the second semiconductor chip 200, which are sequentially stacked. The first semiconductor chip 100 may include a portion of the first substrate 10 and a portion of the first interconnection structure layer 120a, which are cut by the cutting process. The second semiconductor chip 200 may include a portion of the second substrate 30 and a portion of the second interconnection structure layer 220a, which are cut by the cutting process. The cut portion of the first substrate 10 may correspond to the first semiconductor layer 110 described with reference to FIG. 2, and the cut portion of the first interconnection structure layer 120a may correspond to the first interconnection structure 120 described with reference to FIG. 2. The cut portion of the second substrate 30 may correspond to the second semiconductor layer 210 described with reference to FIG. 2, and the cut portion of the second interconnection structure layer 220a may correspond to the second interconnection structure 220 described with reference to FIG. 2.

Figure 5C:
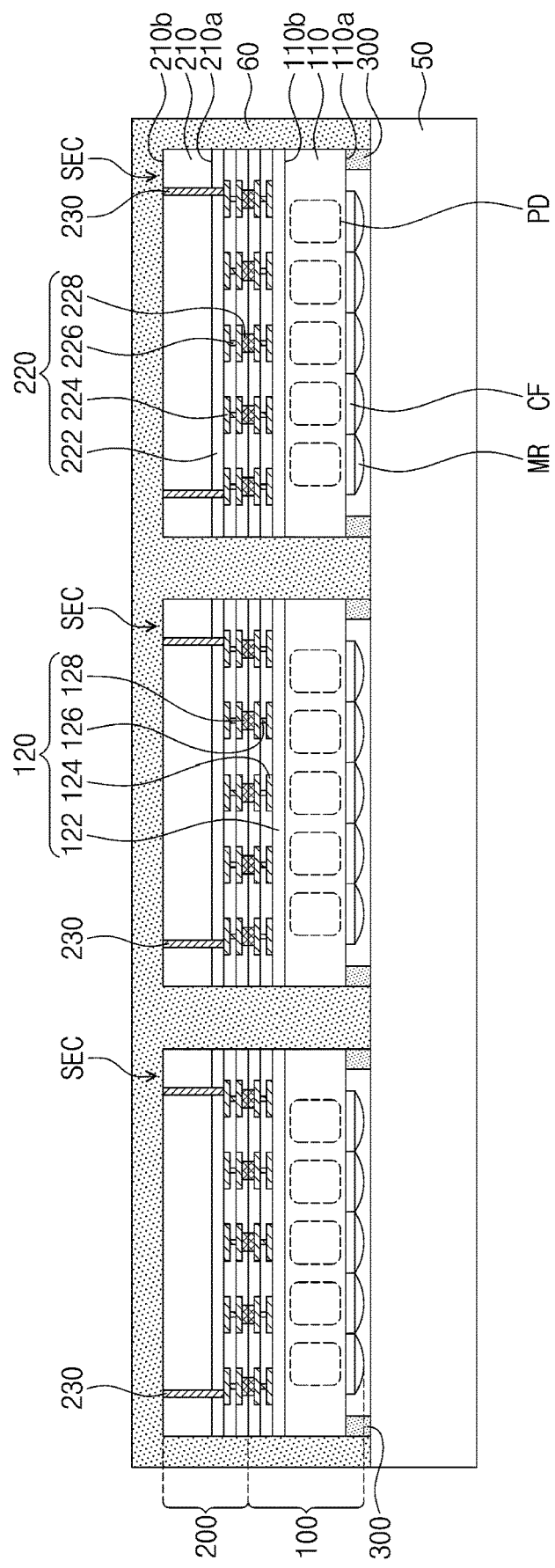

Referring to FIG. 5C, the semiconductor chips SEC may be disposed on a glass substrate 50. The semiconductor chips SEC may be spaced apart from each other by a specific distance on the glass substrate 50. Each of the semiconductor chips SEC may be attached to the glass substrate 50 by the adhesive layer 300. For example, the adhesive layer 300 may be provided on an edge of the top surface 110a of each of the first semiconductor layer 110 and may be spaced apart from the outermost ones of the color filters CF and the outermost ones of the micro lenses MR by a specific distance, and the adhesive layer 300 may be attached to a surface of the glass substrate 50. Accordingly, the semiconductor chips SEC may be attached to the glass substrate 50 by the adhesive layers 300. The micro lenses MR may be disposed adjacent to a surface of the glass substrate 50. The micro lenses MR and the glass substrate 50 may be spaced apart from each other by a specific distance. The micro lenses MR and the color filters CF between the first semiconductor layer 110 and the glass substrate 50 may be sealed by the glass substrate 50 and the adhesive layers 300.

A mold layer 60 may be disposed on a surface of the glass substrate 50. The mold layer 60 may at least partially fill a space between the semiconductor chips SEC and may be on and at least partially cover the bottom surface 210b of the second semiconductor layer 210. Due to the adhesive layers 300, the mold layer 60 may not be provided in spaces, which are disposed between the first semiconductor layer 110 and the glass substrate 50, and in which the micro lenses MR and the color filters CF are provided. The mold layer 60 may comprise, for example, an epoxy molding compound.

Figure 5D:
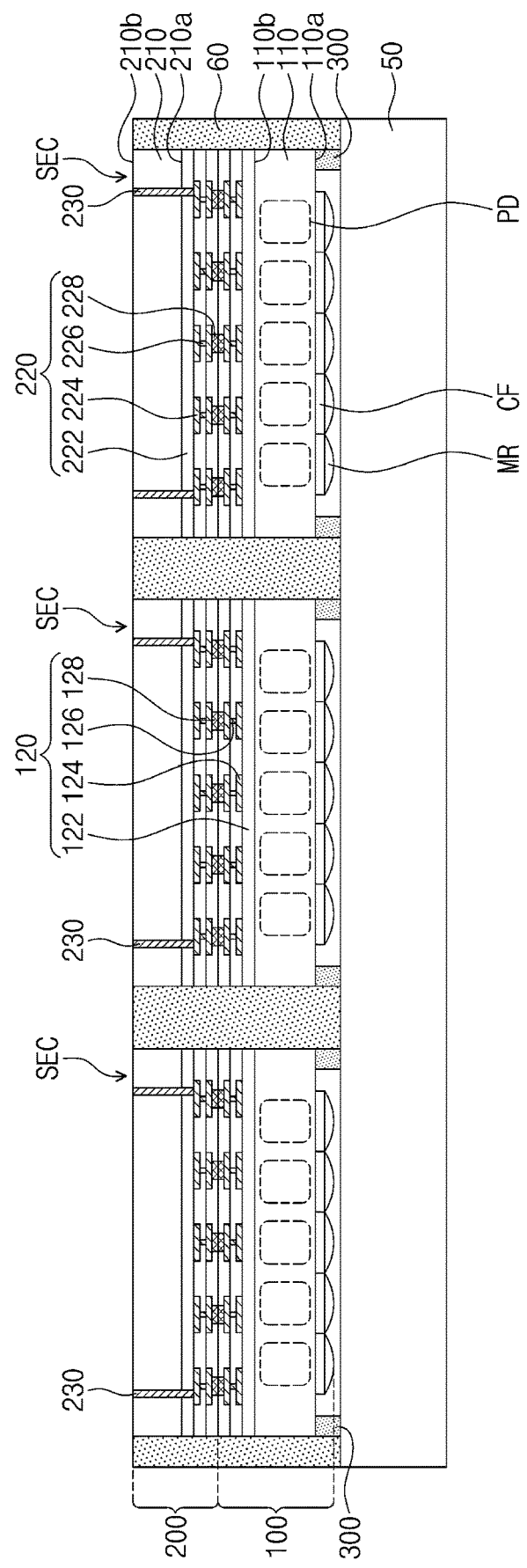

Referring to FIG. 5D, a planarization process may be performed on the mold layer 60. The planarization process may be performed to expose the bottom surfaces 210b of the second semiconductor layers 210, i.e., the bottom surfaces 210b of the second semiconductor layers 210 may be free of the mold layer 60. A surface of the mold layer 60 may be coplanar with the bottom surfaces 210b of the second semiconductor layers 210. The mold layer 60 may be formed on and may at least partially cover side surfaces of the semiconductor chips SEC. The planarization process may be, for example, a chemical mechanical polishing process.

Figure 5E:
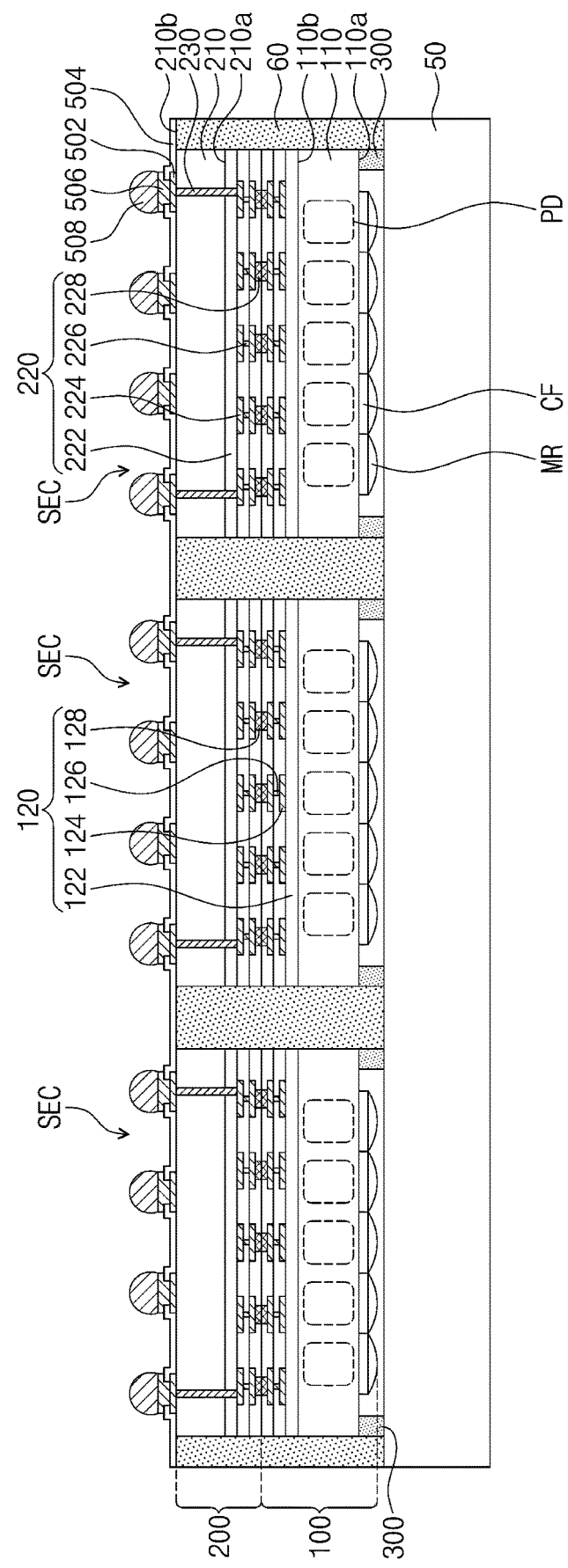

Referring to FIG. 5E, the redistributions 502 may be formed on a surface of the mold layer 60 and the bottom surfaces 210b of the second semiconductor layers 210. The formation of the redistributions 502 may include forming a metal layer (not shown) on and to at least partially cover the surface of the mold layer 60 and the bottom surfaces 210b of the second semiconductor layers 210 and performing a patterning process on the metal layer. The redistributions 502 may be formed to be in physical contact with the through vias 230. Accordingly, the redistributions 502 may be electrically connected to the through vias 230. The protection insulating layer 504 may be formed on the surface of the mold layer 60 and the bottom surfaces 210b of the second semiconductor layers 210. The formation of the protection insulating layer 504 may include forming the protection insulating layer 504 on and to at least partially cover the surface of the mold layer 60, the bottom surfaces 210b of the second semiconductor layers 210, and the redistributions 502, and performing an etching process to expose portions of the redistributions 502, i.e., portions of the redistributions 502 may be free of the protection insulating layer 504). The terminal pads 506 may be formed on portions of the redistributions 502, which are exposed by the protection insulating layer 504. The formation of the terminal pads 506 may include forming a metal layer (not shown) on and to at least partially cover portions of the redistributions 502 and the protection insulating layer 504, and performing a patterning process on the metal layer. The connection terminals 508 may be formed on the terminal pads 506.

Figure 5F:
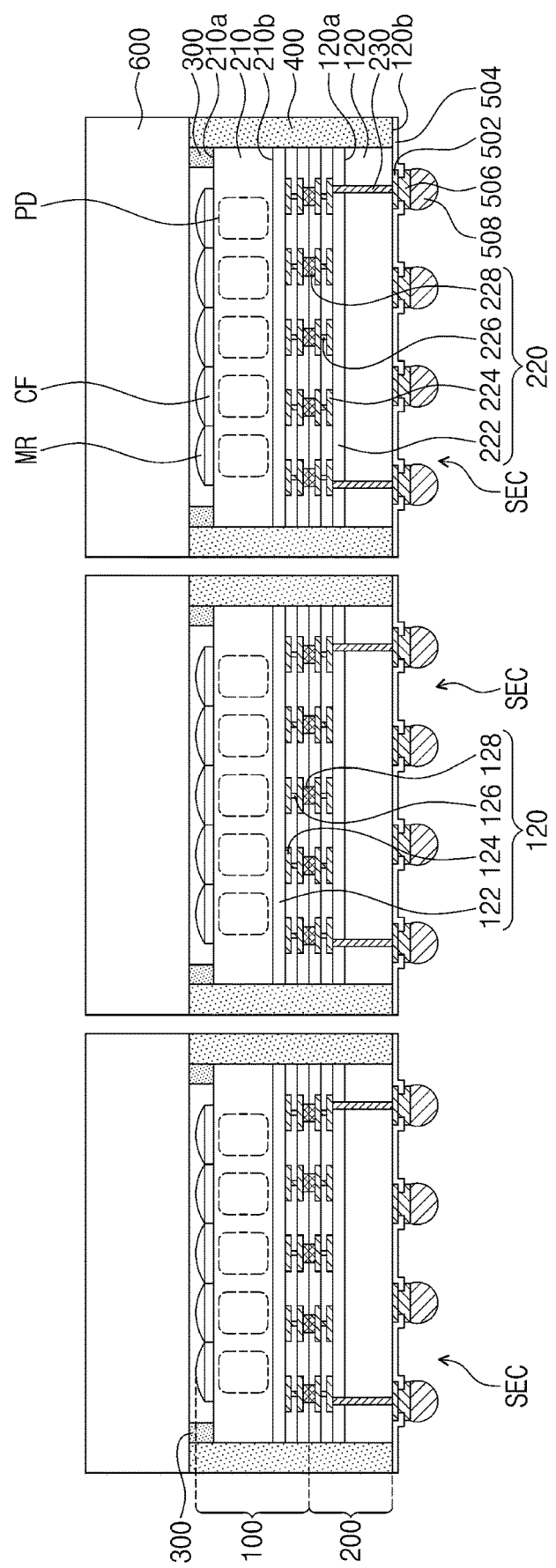

Referring to FIG. 5F, a cutting process may be performed on the glass substrate 50, the mold layer 60, and the protection insulating layer 504 to form a plurality of semiconductor packages. The glass substrate 50 may be cut by a cutting process to form a plurality of glass patterns 600 spaced apart from each other, and the mold layer 60 may be cut by the cutting process to form a plurality of molding patterns 400 spaced apart from each other. The protection insulating layer 504 may be cut by the cutting process to form a plurality of protection insulating layers 504 spaced apart from each other. Each of the semiconductor packages, which are formed by the cutting process, may include the semiconductor chip SEC, which includes the first and second semiconductor chips 100 and 200, the molding pattern 400, the glass pattern 600, and the re-distribution structure 500. The re-distribution structure 500 may include the redistributions 502, the protection insulating layer 504, the terminal pads 506, and the connection terminals 508.

According to an embodiment of the inventive concept, a semiconductor chip including image sensors may be electrically connected to external elements through some through vias of a second semiconductor chip and redistributions electrically connected to the through vias. Accordingly, an area of a semiconductor chip may be decreased and redistributions may be freely formed on a bottom surface of the semiconductor chip. Thus, it may be possible to form connection terminals on the redistributions with an increased degree of freedom. In addition, because the area of the semiconductor chip is decreased, an area of the final semiconductor package may also be decreased.

While example embodiments of the inventive concepts have been particularly shown and described, it will be understood by one of ordinary skill in the art that variations in form and detail may be made therein without departing from the scope of the attached claims

What is claimed is:

1. A method of fabricating packaged semiconductor chips, comprising:
forming semiconductor chips;
attaching each of the semiconductor chips to a glass substrate by a respective frame-shaped adhesive layer that attaches to edges to the respective semiconductor chip that face the glass substrate, and supports the respective semiconductor chip above a surface of the glass substrate so that a gap is present between a majority of the respective semiconductor chip that faces the glass substrate and the surface of the glass substrate;
forming a molding layer on the glass substrate, the molding layer filling a space between the semiconductor chips, contacting the adhesive layers in the space between the semiconductor chips, and covering the semiconductor chips;
performing a planarization process on the mold layer to expose portions of the semiconductor chips; and
performing a cutting process on the glass substrate and the mold layer to form a plurality of semiconductor packages, which each include a respective portion of the glass substrate as a glass pattern extending opposite the gap between the corresponding semiconductor chip and the glass pattern.

2. The method of claim 1, wherein forming semiconductor chips comprises:
forming photoelectric conversion devices in a first substrate;
forming color filters on a top surface of the first substrate;
forming micro lenses on the color filters;
forming through vias in a second substrate;
bonding the first substrate to the second substrate; and
performing cutting process on the combined structure of the first substrate and the second substrate to form the plurality of semiconductor chips.

3. The method of claim 2, wherein the adhesive layers are on an edge of one surface of the first semiconductor chip, which opposites to the second substrate.

4. The method of claim 2, wherein the first substrate and the second substrate are electrically connected through interconnection structures which is between the first substrate and the second substrate,
the first substrate is electrically connected to the through vias of the second substrate.

5. The method of claim 2, wherein the color filters and the micro lenses are in the gaps between the semiconductor chips and the glass substrate.

6. The method of claim 1, wherein at least a portion of one upper surface of the semiconductor chip, which faces the glass substrate, being free of the molding layer.

7. The method of claim 1, wherein a bottom surface of the molding pattern is in physical contact with the glass substrate.

8. The method of claim 1, wherein a bottom surface of each of the adhesive layers is coplanar with a bottom surface of the molding layer.

9. The method of claim 1, wherein an outer surface of each of the adhesive layers is coplanar with a side surface of one of the semiconductor chips.

10. The method of claim 1, further comprising, before the cutting process on the glass substrate and the mold layer, forming a re-distribution structure on the molding layer and the semiconductor chips,
wherein, during the cutting process, the re-distribution structure was cut together.

11. The method of claim 10, wherein the re-distribution structure further comprises terminal pads on the redistributions; and outer terminals on the terminal pads, and
wherein the outer terminals overlap the molding layer when viewed in a plan view.

12. The method of claim 10, wherein molding layer fill a space between the re-distribution structure and the glass substrate beside the semiconductor chips.

13. A method of fabricating packaged semiconductor devices, comprising:
forming a first multi-chip device comprising a stack of first and second chips that are bonded together;
forming a second multi-chip device comprising a stack of third and fourth chips that are bonded together;
attaching the first multi-chip device to a transparent substrate using a first frame-shaped adhesive layer that bonds to the transparent substrate, and also bonds to outer edges of the first chip so that a majority of a first surface of the first chip is supported opposite a first surface of the transparent substrate and a first gap extends therebetween;
attaching the second multi-chip device to the transparent substrate using a second frame-shaped adhesive layer that bonds to the transparent substrate, and also bonds to outer edges of the third chip so that a majority of a first surface of the third chip is supported opposite the first surface of the transparent substrate and a second gap extends therebetween;
forming a molding layer that contacts the first surface of the transparent substrate, extends between the first and second frame-shaped adhesive layers and fills a gap between the first and second multi-chip devices;
forming a re-distribution structure that extends laterally across the second and fourth chips within the first and second multi-chip devices, respectively, and across a portion of the molding layer within the gap between the first and second multi-chip devices; and
cutting through the molding layer and the transparent substrate to separate the first and second multi-chip devices into first and second packaged semiconductor devices, respectively.

14. The method of claim 13, wherein the first chip includes an array of microlenses adjacent the first surface thereof; and wherein the microlenses in the array have respective light receiving surfaces thereon that are exposed to the first gap between the first surface of the first chip and the first surface of the transparent substrate.

15. The method of claim 13, wherein the molding layer contacts sidewalls of the first and second frame-shaped adhesive layers within the gap between the first and second multi-chip devices.

16. The method of claim 13, wherein forming a re-distribution structure is preceded by planarizing the molding layer to expose a surface of the second chip and a surface of the fourth chip.

17. The method of claim 16, wherein the re-distribution structure includes first solder bumps thereon, which are electrically coupled to electrical elements of an image sensor with the first chip, via electrical interconnect structures within the second chip.

18. The method of claim 14, wherein the first gap is an air-filled gap.

19. A method of fabricating packaged image sensors, comprising:
attaching a first image sensor chip to a first surface of a transparent substrate using a first frame-shaped adhesive layer that bonds to the first surface, and also bonds to outer edges of the first image sensor chip so that a majority of a first light receiving surface of the first image sensor chip is supported opposite the first surface and a first gap extends between the first light receiving surface and the first surface;
attaching a second image sensor chip to the first surface using a second frame-shaped adhesive layer that bonds to the first surface, and also bonds to outer edges of the second image sensor chip so that a majority of a second light receiving surface of the second image sensor chip is supported opposite the first surface and a second gap extends between the second light receiving surface and the first surface;
forming a molding layer that contacts the first surface, extends between the first and second frame-shaped adhesive layers and fills a gap between the first and second image sensor chips;
forming a re-distribution structure on the first and second image sensor chips and on a portion of the molding layer within the gap between the first and second image sensor chips; and
cutting through the molding layer and the transparent substrate in sequence to yield first and second packaged image sensor chips.

20. The method of claim 19, wherein the first and second gaps are first and second air-filled gaps, respectively.

* * * * *